(12) United States Patent
Coteus et al.

(10) Patent No.: US 8,343,804 B2
(45) Date of Patent: Jan. 1, 2013

(54) IMPLEMENTING MULTIPLE DIFFERENT TYPES OF DIES FOR MEMORY STACKING

(75) Inventors: Paul W. Coteus, Yorktown, NY (US); Kyu-hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/364,346

(22) Filed: Feb. 2, 2012

(65) Prior Publication Data

US 2012/0196402 A1    Aug. 2, 2012

Related U.S. Application Data

(62) Division of application No. 12/861,056, filed on Aug. 23, 2010.

(51) Int. Cl.
*H01L 21/00*   (2006.01)

(52) U.S. Cl. .............. 438/107; 257/E21.499; 438/460

(58) Field of Classification Search .......... 438/106–127, 438/460–464
See application file for complete search history.

(56) References Cited

U.S. PATENT DOCUMENTS

| 7,446,420 B1 | 11/2008 | Kim |
| 7,701,252 B1 | 4/2010 | Chow et al. |
| 2009/0321893 A1 | 12/2009 | Somasekhar et al. |
| 2011/0246746 A1 | 10/2011 | Keeth et al. |
| 2012/0043664 A1* | 2/2012 | Coteus et al. ............. 257/774 |

* cited by examiner

*Primary Examiner* — Richard A. Booth
(74) *Attorney, Agent, or Firm* — Joan Pennington

(57) ABSTRACT

A method and structure are provided for implementing multiple different types of dies for memory stacking. A common wafer is provided with a predefined reticle type. The reticle type includes a plurality of arrays, and a plurality of periphery segments. A plurality of through-silicon-vias (TSVs) is placed at boundaries between array and periphery segments. Multiple different types of dies for memory stacking are obtained based upon selected scribing of the dies from the common wafer.

13 Claims, 18 Drawing Sheets

IMPLEMENTING MULTIPLE DIFFERENT TYPES OF DIES FOR MEMORY STACKING

This application is a divisional application of Ser. No. 12/861,056 filed on Aug. 23, 2010.

FIELD OF THE INVENTION

The present invention relates generally to the data processing field, and more particularly, relates to a method and structure for implementing multiple different types of dies for memory stacking.

DESCRIPTION OF THE RELATED ART

Advanced memory stacking technology is emerging. One example illustrated in FIGS. 1A, and 1B, is a master-slave structure including a printed circuit board (PCB), a master die, and a plurality of slave dies. For example, in the illustrated prior art master-slave, only a specific die, the bottom die labeled master in the stacked package communicates to the outside of the package to save standby power by shutting down circuitries in other dies that are not required to operate. FIG. 1B illustrates the bottom master die, which includes a plurality of arrays and a periphery segment centrally located between the arrays. Multiple through-silicon-vias (TSVs) are placed within the periphery segment.

There are two possible ways of die implementations for this structure. One option-A is to use an exactly same die to implement both master and slave, and another option-B is to use completely different dies where the master die has everything but the slave dies has only minimum blocks and also has smaller die size than master die. In option-A, only one type of wafer is necessary but each of the multiple slave dies 1, 2, 3 is larger than required, which results in some wasting of silicon area. In option-B, two different wafers and reticles are required to be manufactured, which results in additional manufacturing cost.

A need exists for an improved method for implementing multiple different types of dies for memory stacking. It is desirable to provide such method that is effective and simple to implement and that does not require expensive processing and fabrication techniques.

SUMMARY OF THE INVENTION

Principal aspects of the present invention are to provide a method and structures for implementing multiple different types of dies for memory stacking. Other important aspects of the present invention are to provide such a method and structure substantially without negative effects and that overcome many of the disadvantages of prior art arrangements.

In brief, a method and structure are provided for implementing multiple different types of dies for memory stacking. A common wafer is provided with a predefined reticle type. The reticle type includes a plurality of arrays, and a plurality of periphery segments. A plurality of through-silicon-vias (TSVs) is placed at boundaries between the array and periphery segments. Multiple different types of dies for memory stacking are obtained based upon selected scribing of the dies.

In accordance with features of the invention, the multiple different types of dies include arrays and the periphery segment dies, arrays only dies, and periphery segment only dies.

In accordance with features of the invention, one reticle type includes a plurality of through-silicon-vias (TSVs) placed at boundaries between arrays.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing multiple different types of dies for memory stacking.

Having reference now to the drawings, in FIGS. 2-18, there are shown structures for implementing multiple different types of dies for memory stacking in accordance with embodiments of the invention. In accordance with features of the invention, a method includes starting with a reticle type or photomask including a pattern for reproducing elements of the memory circuit to be created on a common semiconductor wafer. The image of the reticle pattern is formed onto the common semiconductor wafer, such as a silicon wafer that is coated with a photosensitive material or photoresist, and multiple different types of dies for memory stacking are obtained by scribing the common wafer.

Figure 1A:
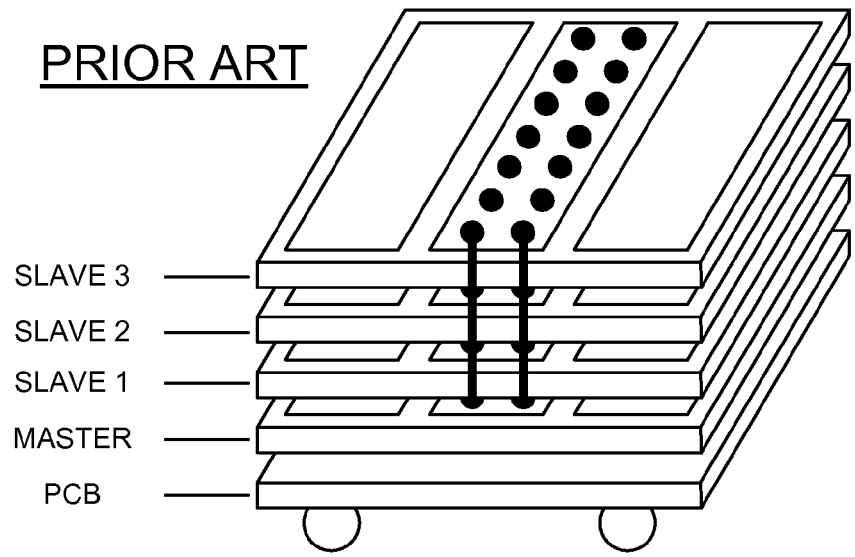
FIGS. 1A, and 1B illustrate a conventional master-slave memory stack structure.
Figure 1B:
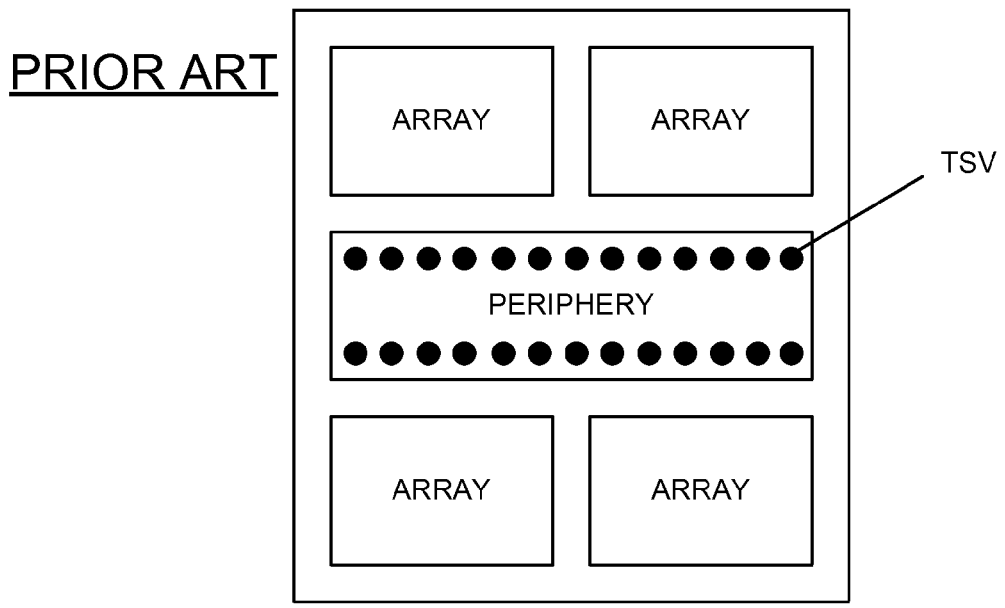
Figure 2:
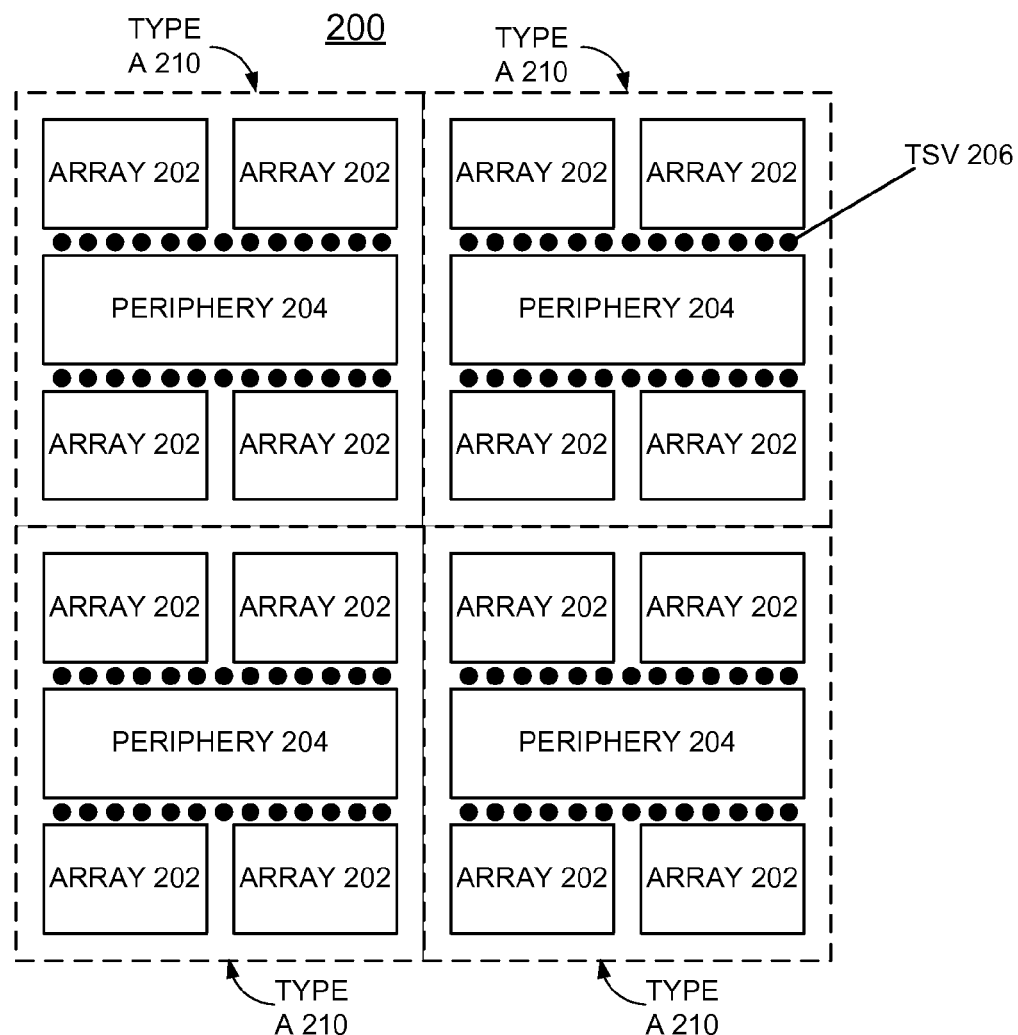
FIGS. 2-18 schematically illustrate structures not to scale for implementing multiple different types of dies for memory stacking in accordance with embodiments of the invention.

Referring now to FIG. 2, there is shown an example first reticle type or photomask generally designated by the reference character 200 in accordance with the preferred embodiment. The first reticle type 200 includes a plurality of arrays 202, and a plurality of periphery segments 204. A plurality of through-silicon-vias (TSVs) 206 is placed at boundaries between array and periphery segments. A first die Type A, 210 indicated in dotted line includes first and second pairs of arrays 202 with one centrally disposed periphery segments 204 between the TSVs 206 and array pairs. Four first die Type A, 210 are included within the example first reticle type 200. Multiple different types of dies, such as die 210 for memory stacking are obtained based upon selected scribing of the dies.

Figure 3:
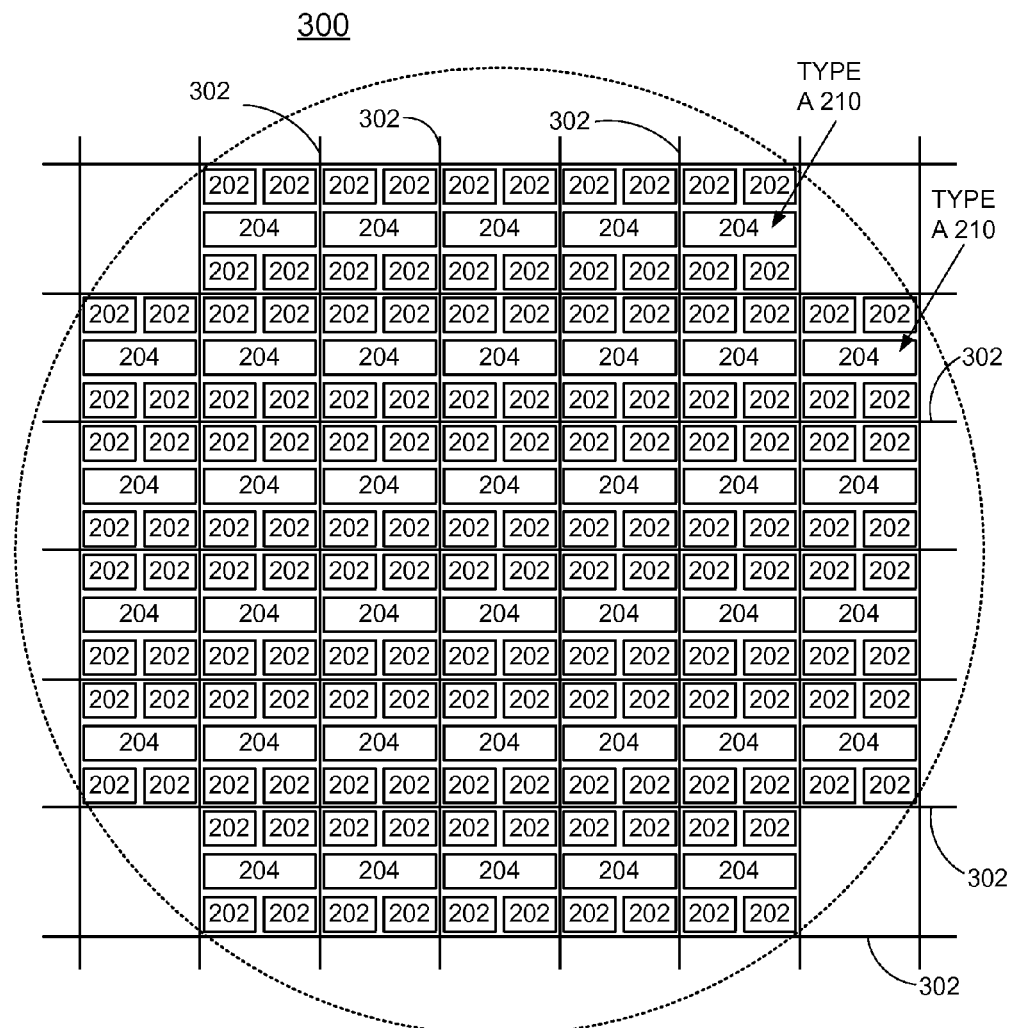

Referring now to FIG. 3, there is shown a first scribing example of a semiconductor wafer generally designated by the reference character 300 in accordance with the preferred embodiment including a plurality of the first reticle type 200. The semiconductor wafer 300 is diced or cut along a plurality of scribe lines 302 into a plurality of the first die Type A, 210.

Each of the plurality of the first die Type A, 210 can be mounted into a respective package.

Figure 4:
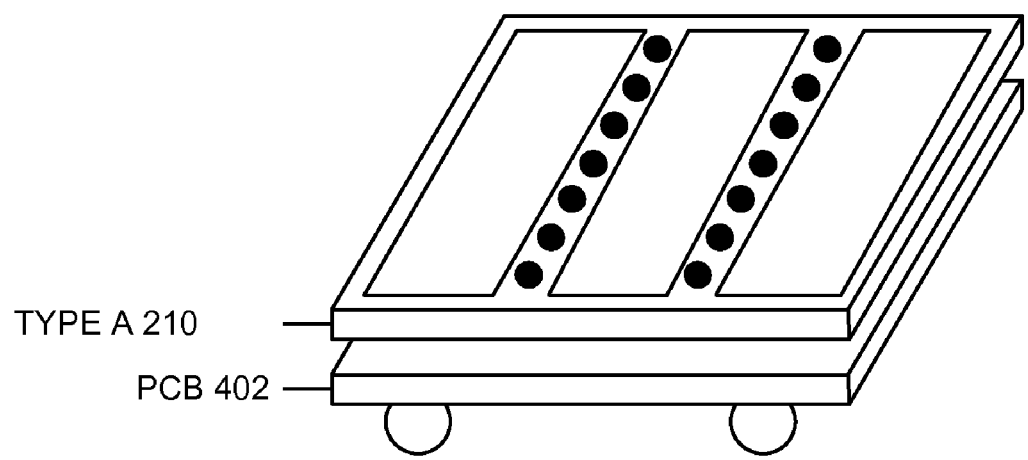

Referring now to FIG. 4, there is shown a first packaging example generally designated by the reference character 400 in accordance with the preferred embodiment using the first reticle type 200. The first packaging example 400 is a stacked structure including the first die Type A, 210 mounted to printed circuit board (PCB) 402.

Figure 5:
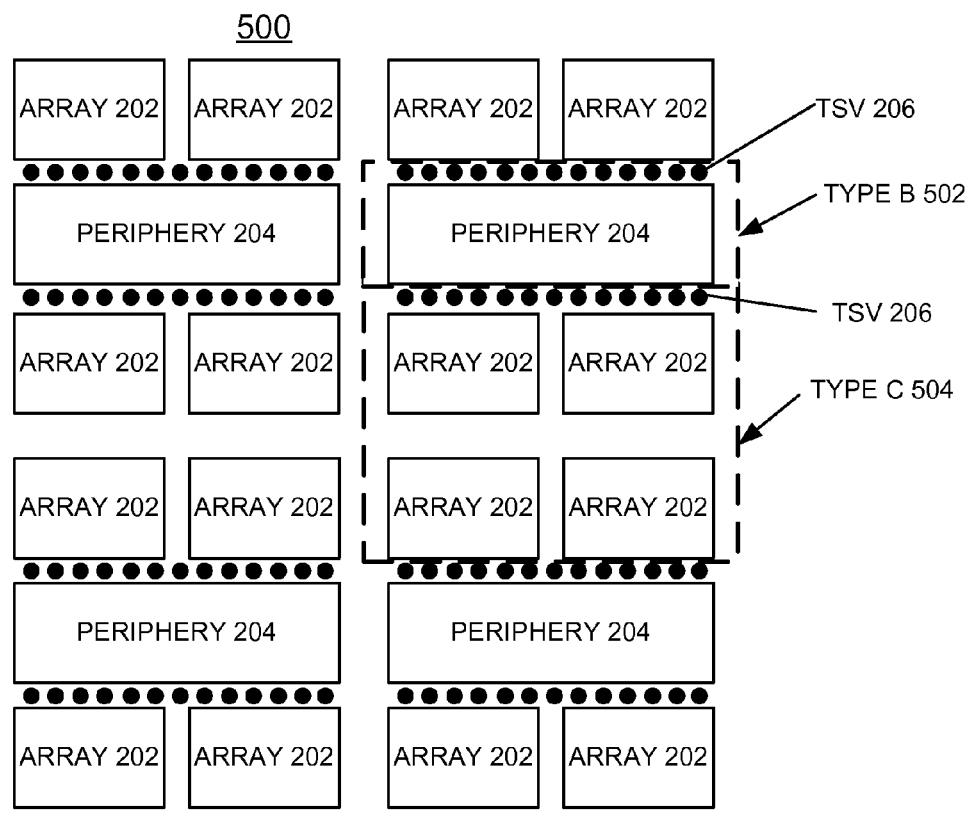

Referring now to FIG. 5, there is shown another scribing example of the first reticle type 200 generally designated by the reference character 500 in accordance with the preferred embodiment. A second die Type B 502 indicated in dotted line includes only the periphery segment 204 disposed below and including the adjacent TSVs 206. A third die Type C 504 indicated in dotted line includes first and second pairs of arrays 202 disposed below and including the adjacent TSVs 206.

Figure 6:
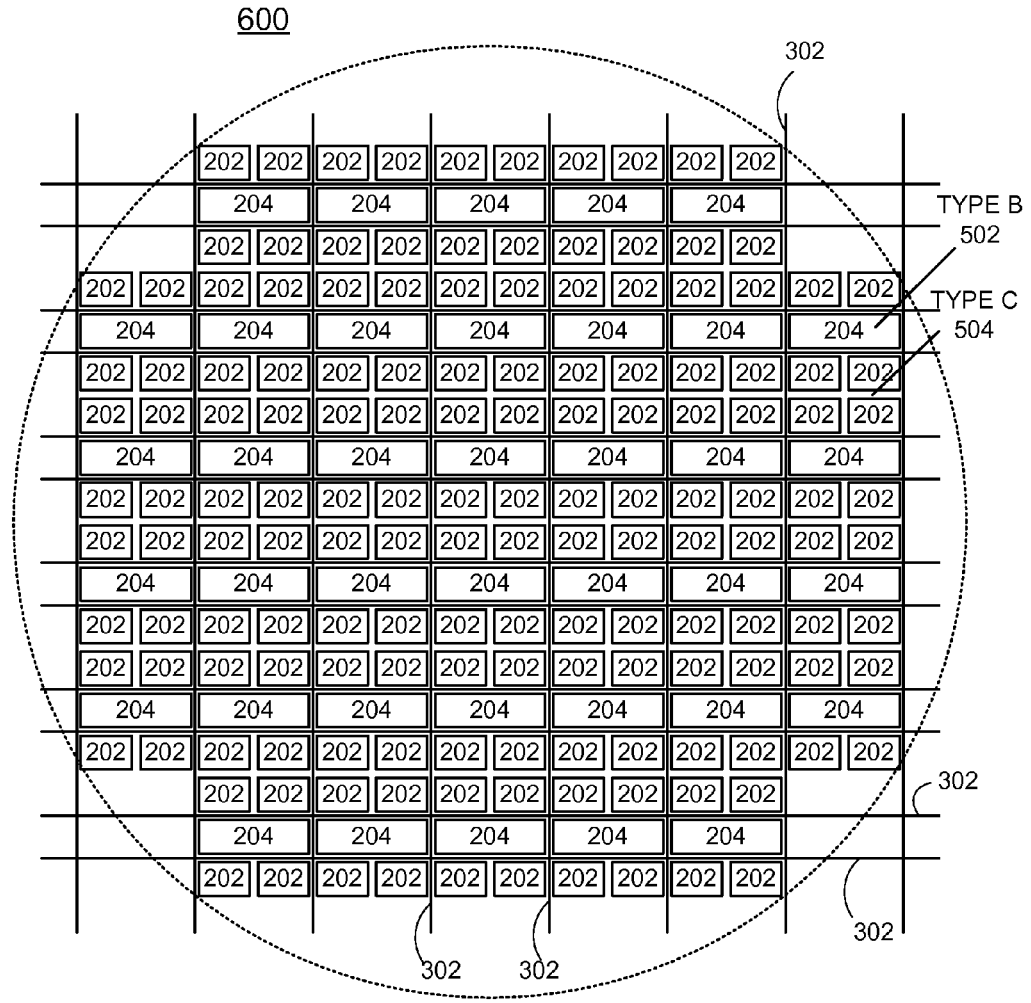

Referring now to FIG. 6, there is shown a scribing example of a semiconductor wafer generally designated by the reference character 600 in accordance with the preferred embodiment including a plurality of copies of the first reticle type 200. The semiconductor wafer 300 is diced or cut along a plurality of scribe lines 302 into a plurality of the second dies Type B, 502 and a plurality of the third dies Type C, 504. Each of the second dies Type B, 502 and the third dies Type C, 504 can be mounted into a respective package.

Figure 7:
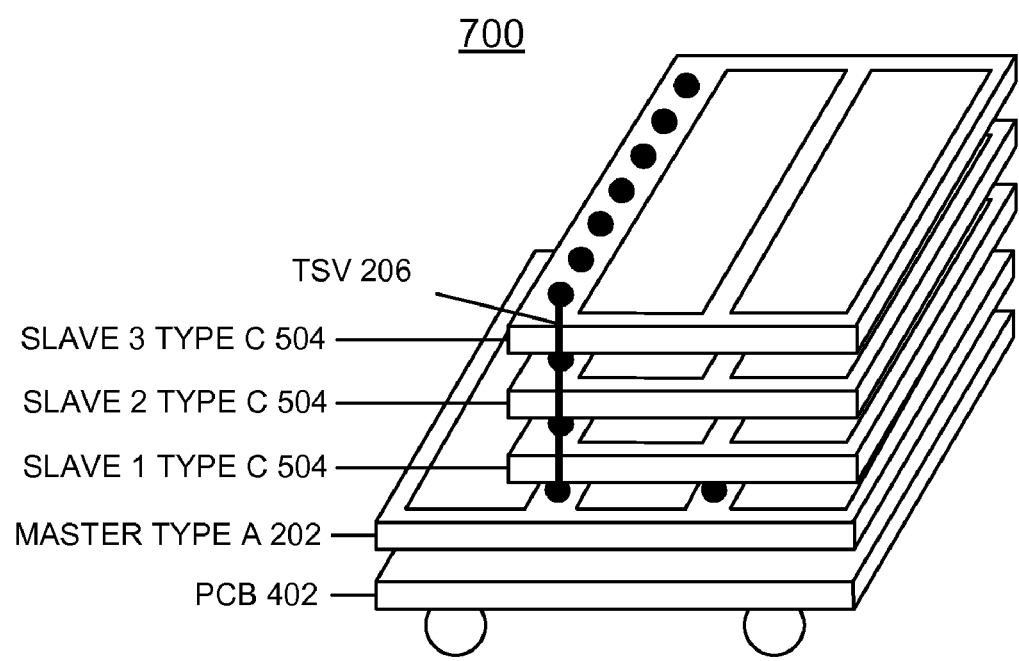

Referring now to FIG. 7, there is shown another packaging example generally designated by the reference character 700 in accordance with the preferred embodiment using the first reticle type 200. The packaging example 700 is a stacked structure including the first die Type A, 210 mounted to the printed circuit board (PCB) 402, and a plurality of slave 1, 2, 3 third dies Type C, 504 mounted above the master first die Type A, 210 and connected by TSVs 206 to the master first die Type A, 210.

Figure 8:
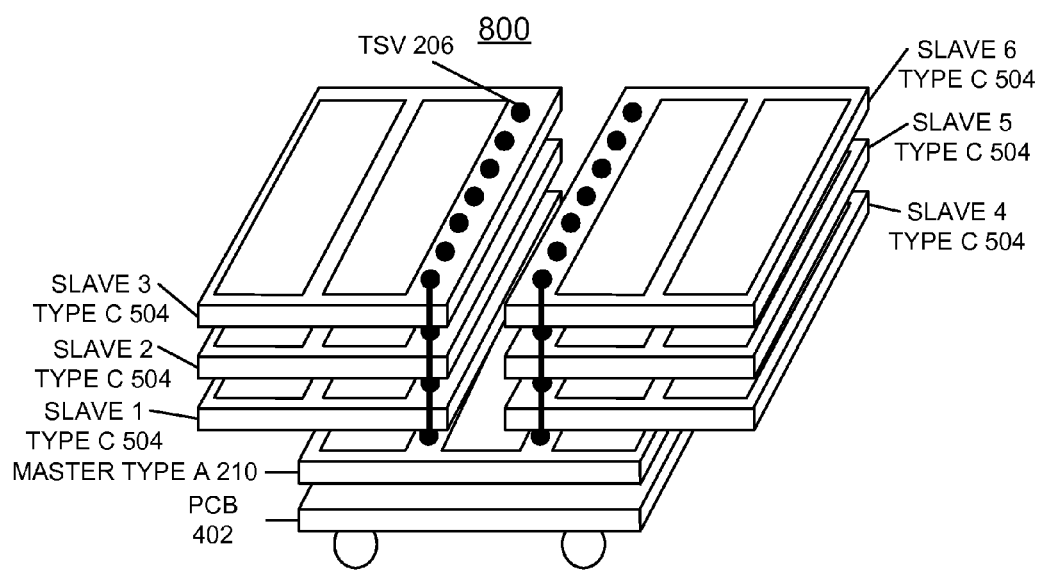

Referring now to FIG. 8, there is shown another packaging example generally designated by the reference character 800 in accordance with the preferred embodiment using the first reticle type 200. The packaging example 800 is a stacked structure including the first die Type A, 210 mounted to the printed circuit board (PCB) 402. The packaging example 800 includes a plurality of slave 1, 2, 3 third dies Type C, 504 and a plurality of slave 4, 5, 6 third dies Type C, 504 respectively mounted above the master first die Type A, 210 and respectively connected to the master first die Type A, 210 by the opposed adjacent TSVs 206 disposed on opposite sides of the periphery 204.

Figure 9:
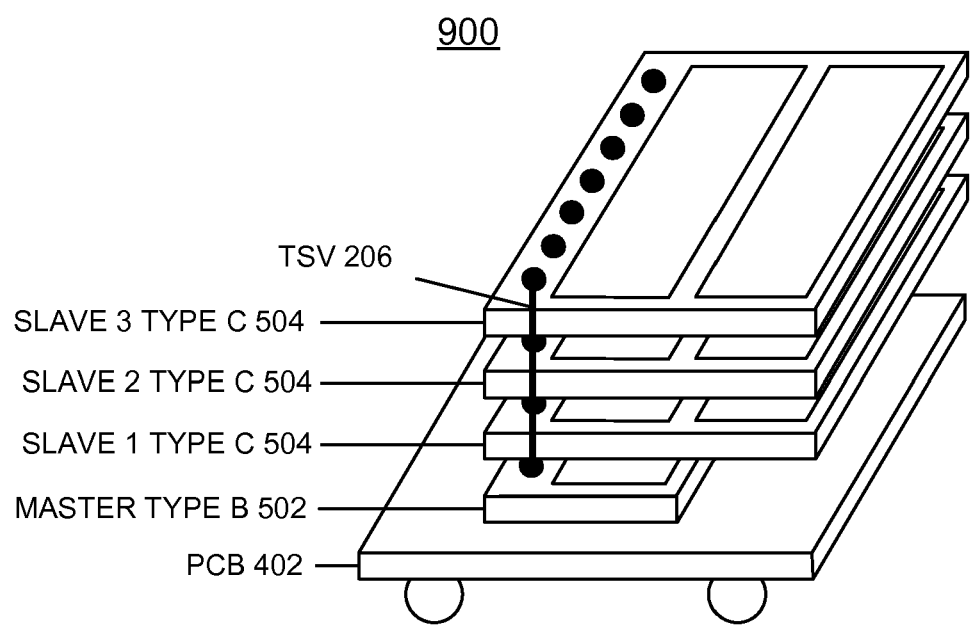

Referring now to FIG. 9, there is shown another packaging example generally designated by the reference character 900 in accordance with the preferred embodiment using the first reticle type 200. The packaging example 900 is a stacked structure including the second die Type B, 502 mounted to the printed circuit board (PCB) 402. The packaging example 900 includes a plurality of slave 1, 2, 3 third dies Type C, respectively mounted above the second die Type B, 502 and respectively connected to the master second die Type B, 502 by adjacent TSVs 206.

Figure 10:
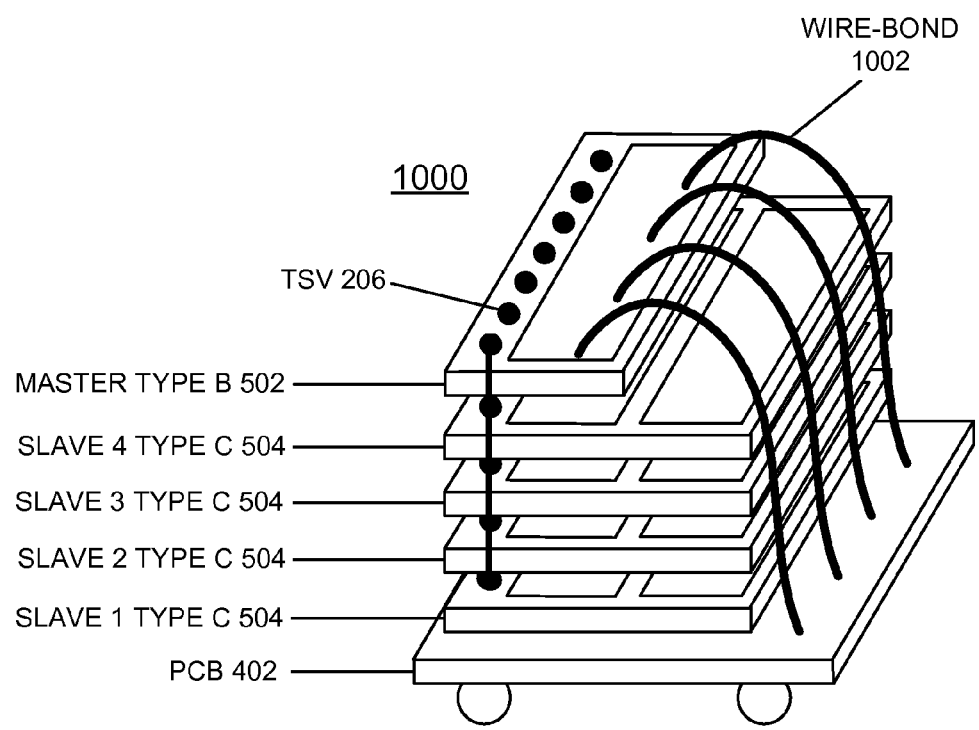

Referring now to FIG. 10, there is shown another packaging example generally designated by the reference character 1000 in accordance with the preferred embodiment using the first reticle type 200. The packaging example 1000 is a stacked structure including the second die Type B, 502 disposed at the top of the stack, and a plurality of slave 1, 2, 3 third dies Type C, respectively mounted above the printed circuit board (PCB) 402. The packaging example 1000 includes the plurality of slave 1, 2, 3 third dies Type C respectively connected to the upper master second die Type B, 502 by adjacent TSVs 206. The upper master second die Type B, 502 is connected to the printed circuit board (PCB) 402, for example by wire-bond 1002, as shown.

Figure 11:
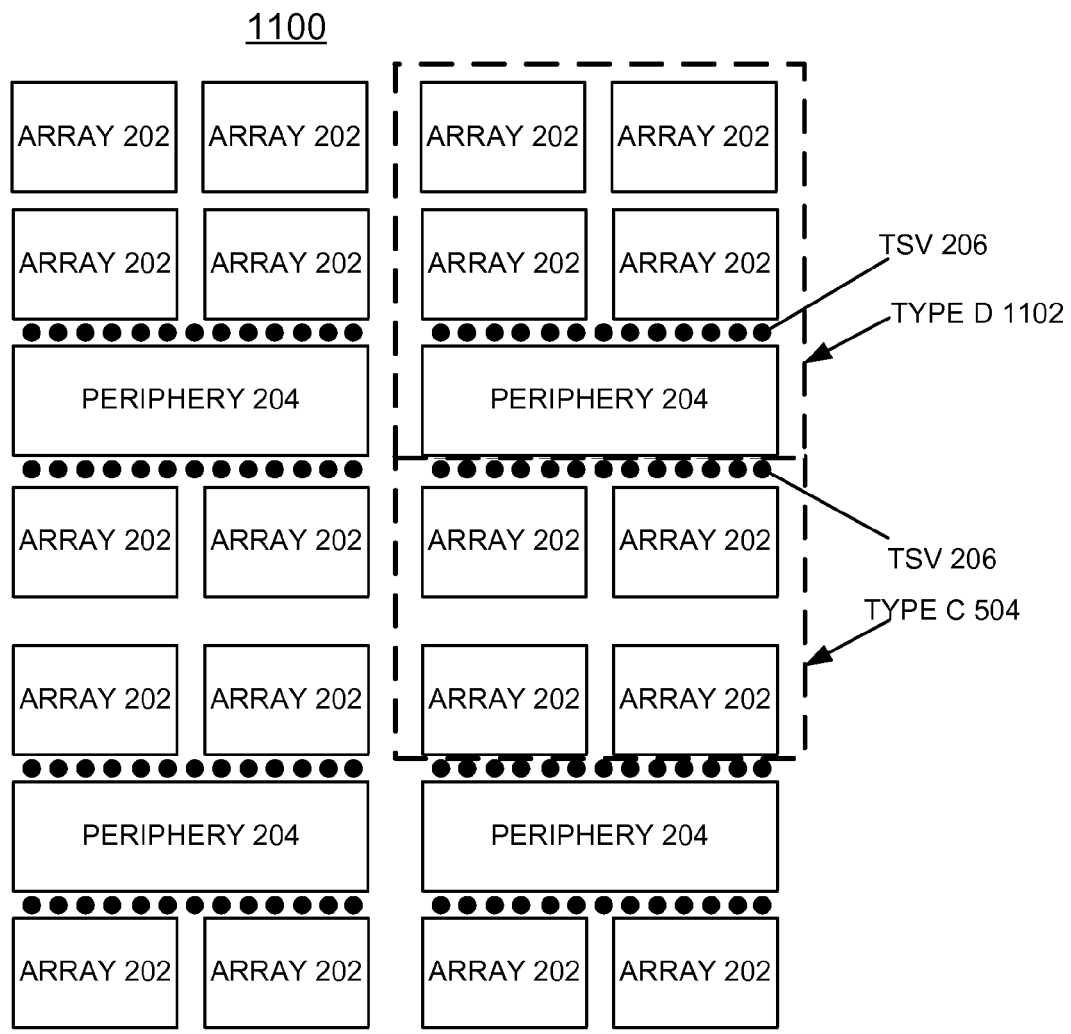

Referring now to FIG. 11, there is shown another scribing example of the first reticle type 200 generally designated by the reference character 1100 in accordance with the preferred embodiment. A fourth die Type D 1102 indicated in dotted line includes first and second pairs of arrays 202 disposed above the periphery segment 204 and including the adjacent TSVs 206. The third die Type C 504 also is shown, as indicated in dotted line includes first and second pairs of arrays 202 disposed below and including the adjacent TSVs 206.

Figure 12:
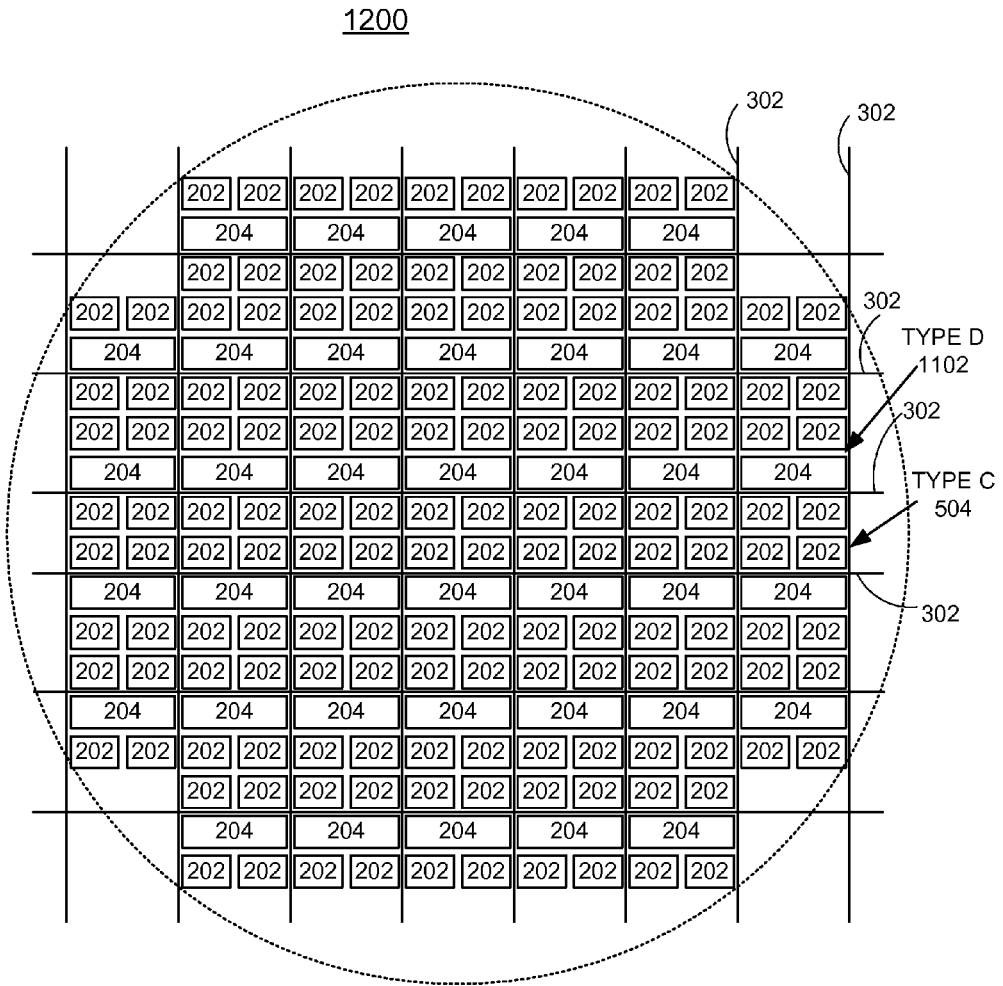

Referring now to FIG. 12, there is shown a scribing example of a semiconductor wafer generally designated by the reference character 1200 in accordance with the preferred embodiment including a plurality of copies of the first reticle type 200. The semiconductor wafer 1200 is diced or cut along the plurality of scribe lines 302 into a plurality of the third dies Type C, 504 and a plurality of the fourth dies Type D, 1102. Each of the second dies Type C, 504 and the fourth dies Type D, 1102 can be mounted into a respective package.

Figure 13:
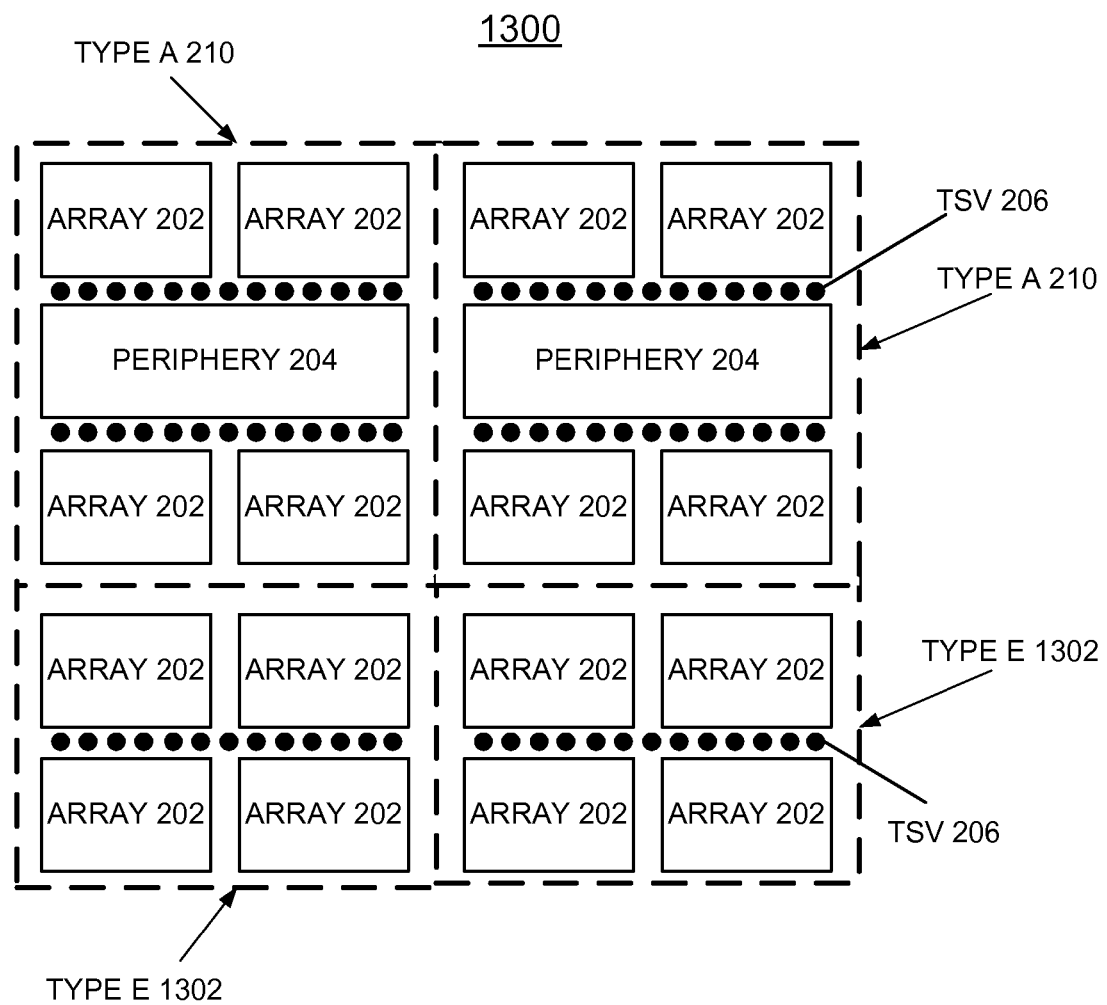

Referring now to FIG. 13, there is shown an example second reticle type or photomask generally designated by the reference character 1300 in accordance with the preferred embodiment. The second reticle type 1300 includes a plurality of arrays 202, and a plurality of periphery segments 204. A plurality of through-silicon-vias (TSVs) 206 is placed at boundaries between respective first and second pairs of arrays 202 and the periphery segments 204, and a plurality of through-silicon-vias (TSVs) 206 is placed at boundaries between lower third and fourth pairs of array 202. The first die Type A, 210 indicated in dotted line includes the first and second pairs of arrays 202 with one centrally disposed periphery segments 204 between the TSVs 206 and the respective array pairs. A fifth die Type E, 1302 indicated in dotted line includes the lower third and fourth pairs of array 202 and the centrally disposed TSVs 206 between these array pairs. Two first dies Type A, 210, and two fifth dies Type E, 1302 are included within the example second reticle type 1300. Multiple different types of dies, such as dies Type A 210, and fifth dies Type E 1302, for memory stacking are obtained based upon selected scribing of the dies.

Figure 14:
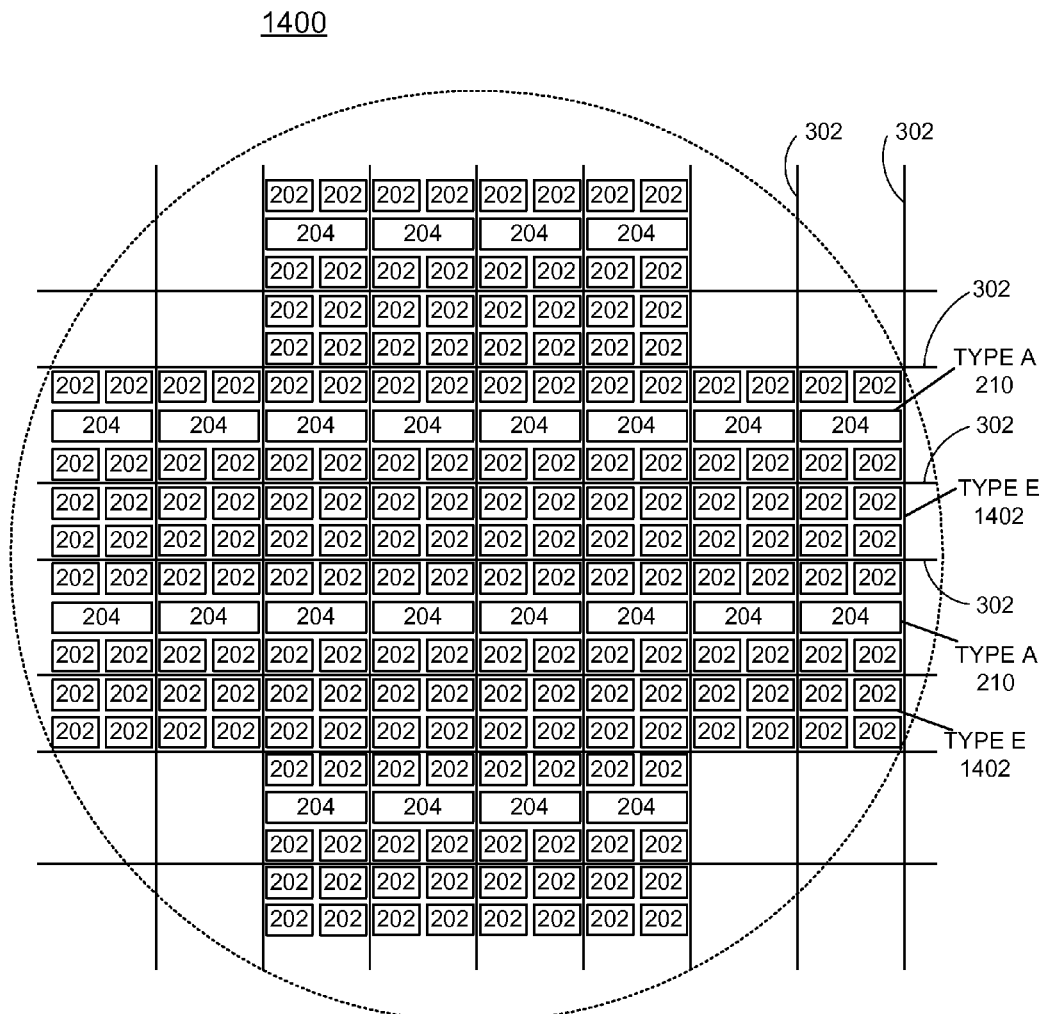

Referring now to FIG. 14, there is shown a scribing example of a semiconductor wafer generally designated by the reference character 1400 in accordance with the preferred embodiment including a plurality of copies of the second reticle type 1300. The semiconductor wafer 1300 is diced or cut along the plurality of scribe lines 302 into a plurality of the first dies Type A, 210 and a plurality of the fifth dies Type E 1302. Each of the first dies Type A, 210 and the fifth dies Type E 1302 can be mounted into a respective package.

Figure 15:
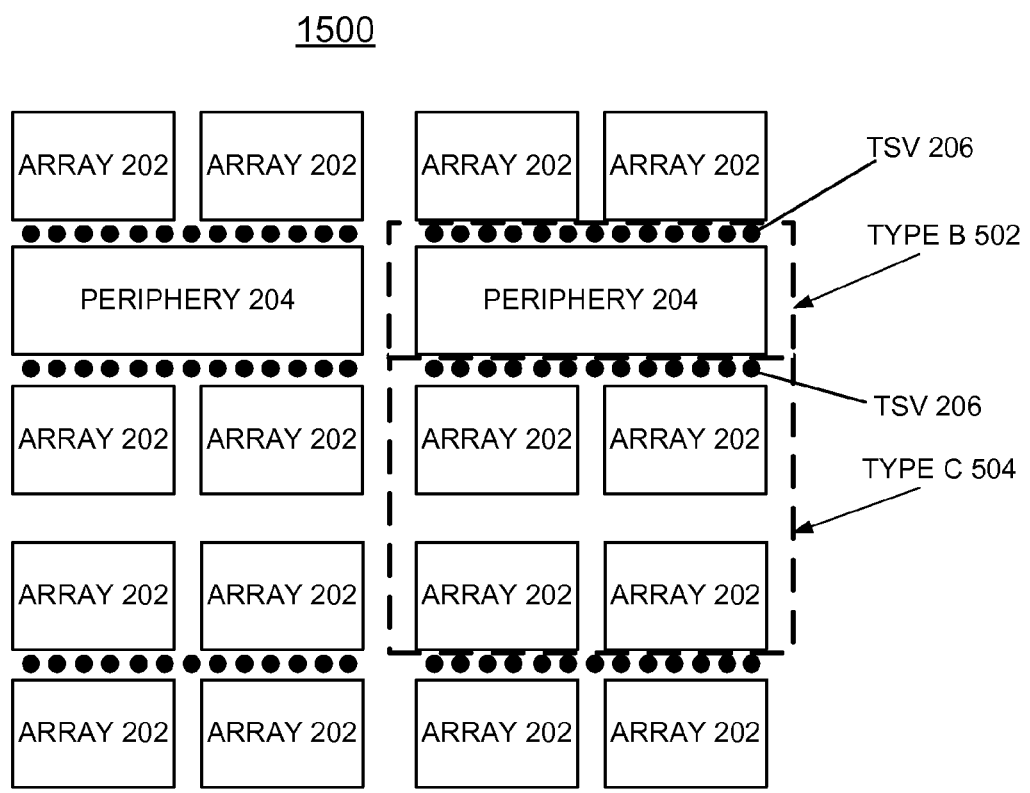

Referring now to FIG. 15, there is shown another scribing example of the second reticle type 1300 generally designated by the reference character 1500 in accordance with the preferred embodiment. The second die Type B 502 indicated in dotted line includes only the periphery segment 204 disposed below and including the adjacent TSVs 206. The third die Type C 504 indicated in dotted line includes first and second pairs of arrays 202 disposed below and including the adjacent TSVs 206.

Figure 16:
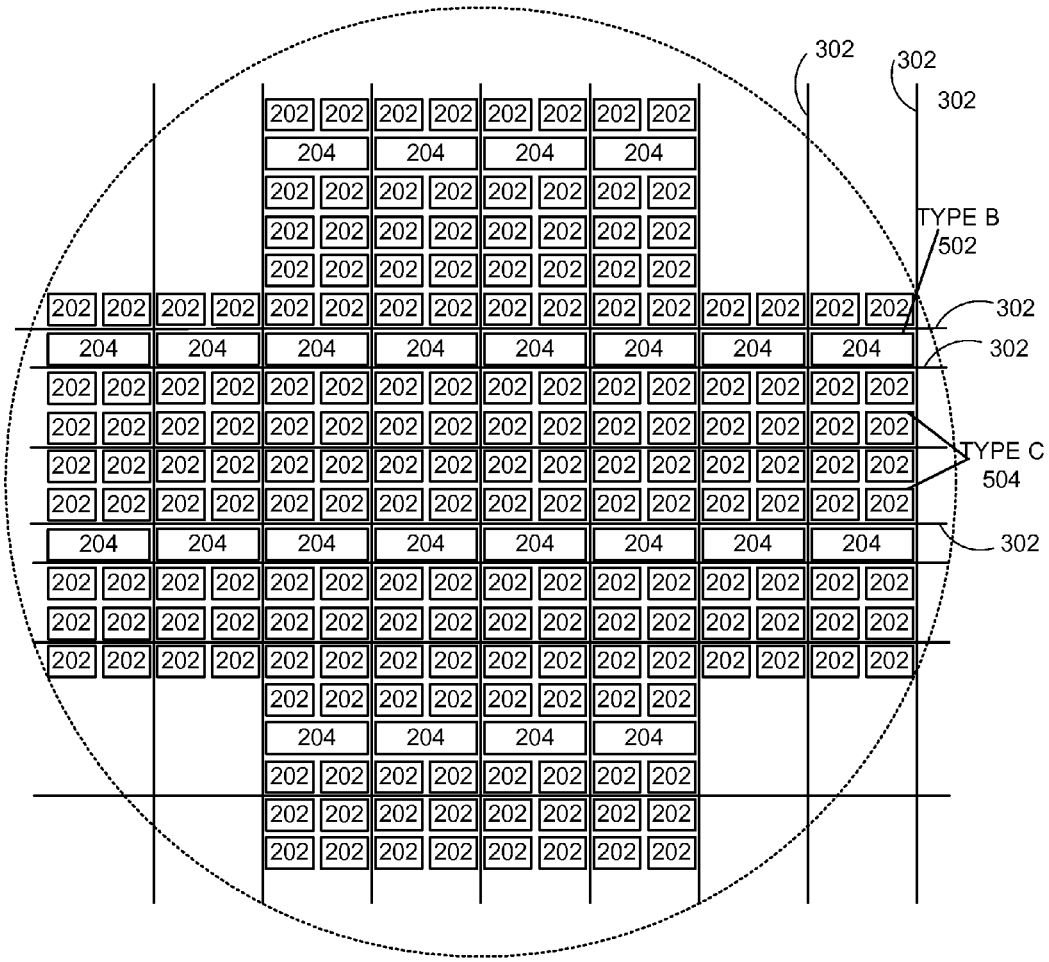

Referring now to FIG. 16, there is shown a scribing example of a semiconductor wafer generally designated by the reference character 1600 in accordance with the preferred embodiment including a plurality of copies of the second reticle type 1300. The semiconductor wafer 1300 is diced or cut along the plurality of scribe lines 302 into a plurality of the second dies Type B 502 and a plurality of third die Type C 504. Each of the second dies Type B 502 and the third die Type C 504 can be mounted into a respective package.

Figure 17:
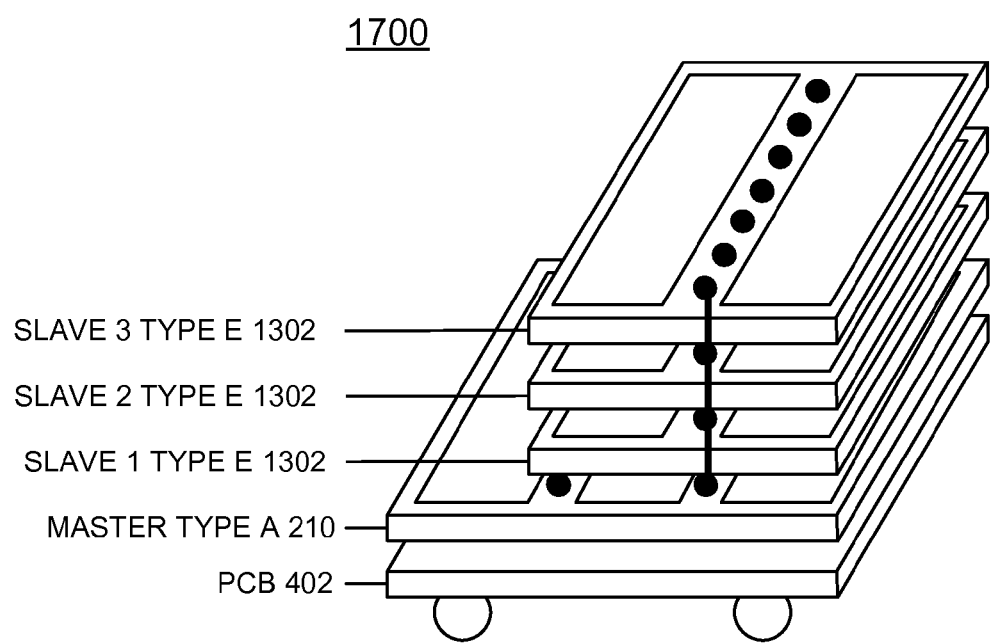

Referring now to FIG. 17, there is shown another packaging example generally designated by the reference character 1700 in accordance with the preferred embodiment using the second reticle type 1300. The packaging example 1700 is a stacked structure including the first die Type A, 210 mounted to the printed circuit board (PCB) 402, and a plurality of slave 1, 2, 3 fifth dies Type E, 1302 mounted above the master first die Type A, 210 and connected by TSVs 206 to the master first die Type A, 210.

Figure 18:
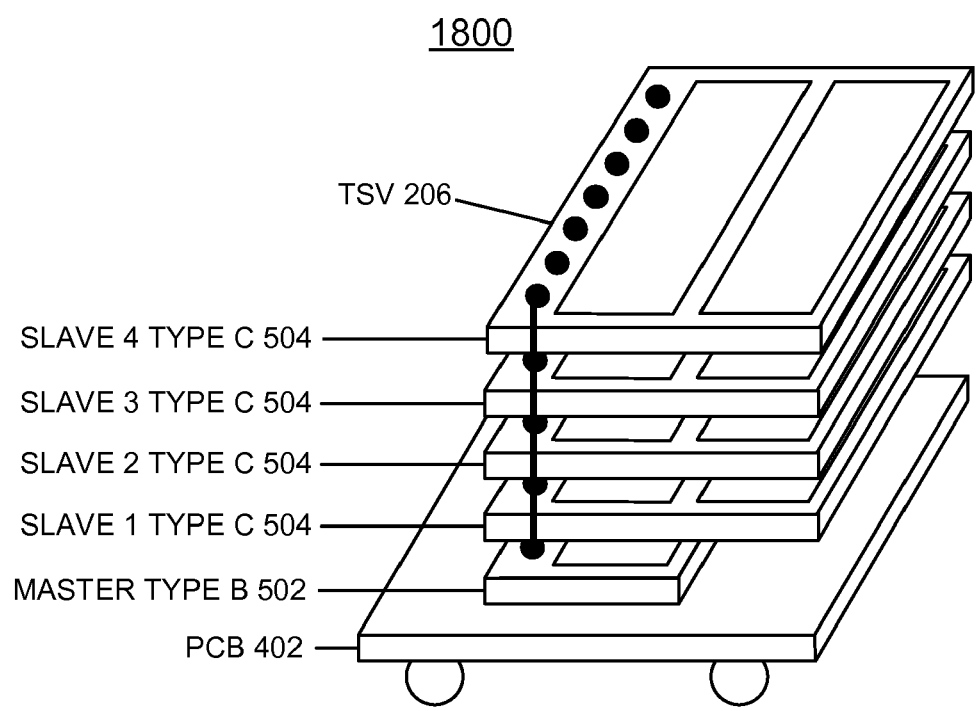

Referring now to FIG. 18, there is shown another packaging example generally designated by the reference character 1800 in accordance with the preferred embodiment using the second reticle type 1300. The packaging example 1800 is a stacked structure including the second die Type B, 502 mounted to the printed circuit board (PCB) 402. The packaging example 1800 includes a plurality of slave 1, 2, 3, 4 third dies Type C, respectively mounted above the second die Type B, 502 and respectively connected to the master second die Type B, 502 by adjacent TSVs 206. Note that the packaging example 1800 using the second reticle type 1300 is similar to the packaging example 900 using the first reticle type 200.

While the present invention has been described with reference to the details of the embodiments of the invention shown in the drawing, these details are not intended to limit the scope of the invention as claimed in the appended claims.

What is claimed is:

1. A method for implementing multiple different types of dies for memory stacking comprising:
    providing a reticle type includes a plurality of arrays, and a plurality of periphery segments;
    placing a plurality of through-silicon-vias (TSVs) at boundaries between array and periphery segments;
    providing a common wafer with said predefined reticle type; and
    obtaining multiple different types of the dies based upon selected scribing of dies from the common wafer.

2. The method as recited in claim 1 wherein providing a reticle type includes a plurality of arrays, and a plurality of periphery segments includes providing first and second pairs of arrays on opposed sides of the periphery segment.

3. The method as recited in claim 2 further includes placing said plurality of through-silicon-vias (TSVs) at opposed boundaries between said first and second pairs of arrays and the periphery segment.

4. The method as recited in claim 1 wherein providing a reticle type includes a plurality of arrays, and a plurality of periphery segments includes providing adjacent pairs of arrays spaced apart by a pair of arrays from the periphery segment.

5. The method as recited in claim 4 further includes placing a plurality of through-silicon-vias (TSVs) at a boundary between said adjacent pairs of arrays.

6. The method as recited in claim 1 wherein obtaining multiple different types of the dies based upon selected scribing of dies from the common wafer includes scribing of dies including first and second pair of said arrays and one said periphery segment and said plurality of through-silicon-vias (TSVs) at boundaries between said first and second pair of said arrays and one said periphery segment.

7. The method as recited in claim 1 wherein obtaining multiple different types of the dies based upon selected scribing of dies from the common wafer includes scribing of dies including a plurality of through-silicon-vias (TSVs) and arrays only.

8. The method as recited in claim 1 wherein obtaining multiple different types of the dies based upon selected scribing of dies from the common wafer includes scribing of dies including a plurality of through-silicon-vias (TSVs) and one said periphery segment only.

9. The method as recited in claim 1 includes forming a memory stack with a first die mounted on a printed circuit board (PCB).

10. The method as recited in claim 9 includes obtaining said first die including a plurality of through-silicon-vias (TSVs) and first and second pairs of arrays and one said periphery segment.

11. The method as recited in claim 9 includes obtaining said first die including plurality of through-silicon-vias (TSVs) and one said periphery segment.

12. The method as recited in claim 10 further includes obtaining a plurality of second dies including through-silicon-vias (TSVs) and arrays only;
    mounting said second dies and said first die in the memory stack connected by said TSVs.

13. The method as recited in claim 11 further includes obtaining a plurality of second dies including through-silicon-vias (TSVs) and arrays only;
    mounting said second dies and said first die in the memory stack connected by said TSVs.

* * * * *